(12) United States Patent
Aida et al.

(10) Patent No.: US 8,490,431 B2
(45) Date of Patent: Jul. 23, 2013

(54) OPTICAL DEVICE AND METHOD FOR MAKING THE SAME

(75) Inventors: Kazuya Aida, Saitama-ken (JP); Yoshinobu Suehiro, Aichi-ken (JP)

(73) Assignees: Toyoda Gosei Co., Ltd., Nishikasugai-Gun, Aichi-Ken (JP); Sumita Optical Glass, Inc., Saitama-Shi, Saitama-Ken (JP)

( * ) Notice: Subject to any disclaimer, the term of this patent is extended or adjusted under 35 U.S.C. 154(b) by 522 days.

(21) Appl. No.: 11/882,602

(22) Filed: Aug. 2, 2007

(65) Prior Publication Data

US 2008/0068845 A1 Mar. 20, 2008

(30) Foreign Application Priority Data

Aug. 3, 2006 (JP) .................. 2006-212632

(51) Int. Cl.
*C03B 29/02* (2006.01)
(52) U.S. Cl.
USPC .......................................................... 65/38
(58) Field of Classification Search
USPC ................................. 65/36, 38, 39
See application file for complete search history.

(56) References Cited

U.S. PATENT DOCUMENTS

| | | | | |
|---|---|---|---|---|
| 3,596,136 A | * | 7/1971 | Fischer | 257/794 |
| 3,596,799 A | * | 8/1971 | Fairchild et al. | 222/5 |
| 3,774,086 A | * | 11/1973 | Vincent, Jr. | 257/95 |
| 3,860,405 A | * | 1/1975 | Coucoulas et al. | 65/42 |
| 3,862,831 A | * | 1/1975 | Berkenblit et al. | 65/60.53 |
| 3,964,093 A | * | 6/1976 | Coucoulas | 257/668 |
| 4,192,576 A | * | 3/1980 | Tung et al. | 359/541 |
| 4,732,599 A | * | 3/1988 | Bennion | 65/30.13 |
| 5,858,051 A | * | 1/1999 | Komiyama et al. | 65/386 |
| 5,958,100 A | * | 9/1999 | Farnworth et al. | 65/47 |
| 6,021,648 A | * | 2/2000 | Zonneveld et al. | 65/33.5 |
| 6,664,567 B2 | * | 12/2003 | Kyoda et al. | 257/53 |
| 6,717,362 B1 | * | 4/2004 | Lee et al. | 313/512 |
| 6,963,168 B2 | * | 11/2005 | Eida et al. | 313/506 |
| 7,075,112 B2 | * | 7/2006 | Roberts et al. | 257/79 |
| 7,565,817 B2 | * | 7/2009 | Schroeder, III | 65/33.2 |
| 2004/0069017 A1 | * | 4/2004 | Li et al. | 65/43 |
| 2006/0049335 A1 | | 3/2006 | Suehiro et al. | |
| 2006/0174652 A1 | * | 8/2006 | Khanarian et al. | 65/38 |
| 2007/0152231 A1 | * | 7/2007 | Destain | 257/99 |
| 2008/0252212 A1 | | 10/2008 | Suehiro et al. | |

FOREIGN PATENT DOCUMENTS

| | | |
|---|---|---|
| JP | 49-74174 (U) | 6/1974 |
| JP | 8-102553 | 4/1996 |
| JP | 11-177129 | 7/1999 |
| JP | 2004-71771 (A) | 3/2004 |
| JP | 2004-200531 (A) | 7/2004 |
| JP | 2005-166941 (A) | 6/2005 |
| JP | 2006-108621 | 4/2006 |
| JP | 2006-111499 (A) | 4/2006 |
| JP | 2006-128457 (A) | 5/2006 |

* cited by examiner

*Primary Examiner* — John Hoffmann
(74) *Attorney, Agent, or Firm* — McGinn IP Law Group, PLLC

(57) ABSTRACT

An optical device has a substrate, an optical element mounted on the substrate, a first glass member sealing the optical element and the substrate, and a second glass member formed on the first glass member and having a mold separation property higher than the first glass member.

14 Claims, 12 Drawing Sheets

OPTICAL DEVICE AND METHOD FOR MAKING THE SAME

The present application is based on Japanese patent application No. 2006-212632, the entire contents of which are incorporated herein by reference.

BACKGROUND OF THE INVENTION

1. Field of the Invention

This invention relates to an optical device in which an optical element is sealed with a glass material, and to a method for making the optical device.

2. Description of the Related Art

Conventionally, optical devices are known in which an optical element such as a light emitting diode (LED) is sealed with a transparent resin material such as epoxy resin. The optical devices have the problem that the transparent resin deteriorates due to a light emitted from the optical element. In particular, when group III nitride compound semiconductor to emit a light with short wavelength is used as the optical element, the transparent resin near the element turns yellow due to a high energy light emitted from the element and a heat generated from the element itself, so that light emission efficiency may be decreased with time.

In order to prevent the deterioration of the sealing material, a light emitting device has been proposed that uses a low-melting glass as a sealing material (e.g., JP-A-08-102553 and JP-A-11-177129).

JP-A-08-102553 discloses a light emitting device that circumferences of the top ends of an LED element, a wire bonding portion, and a lead portion are covered with a transparent sealing material of a low-melting glass. The low-melting glass may be a glass with selenium, thallium, arsenic, sulfur etc. added thereto to yield a melting point of 130° C. to 350° C.

Further, JP-A-11-177129 discloses a light emitting device that a GaN based LED element with a refractive index of about 2.3 is sealed with a low-melting glass with a refractive index of about 2. In this light emitting device, by using the GaN based LED element and the low-melting glass with the refractive index described above, a light to be totally reflected on the interface between the LED element and the low-melting glass can be decreased.

However, the light emitting devices in JP-A-08-102553 and JP-A-11-177129 need to be produced by processing the still hard glass material even when using the low-melting glass, so that it is impossible to realize the devices by using the conventional resin sealing process. Further, properties and components necessary for realizing the device are not known yet.

Therefore, the inventors checked up issues in realizing the inorganic material sealing process and solved them, where a light emitting device is proposed that can actually obtain effects expected by the glass sealing (e.g., JP-A-2006-108621). JP-A-2006-108621 discloses the light emitting device that the substrate and the glass member are bonded to each other by hot pressing, where a ceramic substrate with an LED chip mounted thereon is supported by a lower mold, and a plate glass member is supported by an upper mold.

However, the light emitting device in JP-A-2006-108621 needs to simultaneously satisfy two processing conditions during the hot pressing, where one is to bond the glass member to the ceramic substrate and the other is to separate the glass member from the upper mold (herein, defined as mold separation property). Therefore, in order to satisfy the two conditions, the acceptable range of temperature of the glass member, pressure applied to the glass member etc. during the hot pressing may be limited, so that the processing may be difficult to apply to a certain material for the substrate and the glass member.

SUMMARY OF THE INVENTION

It is an object of the invention to provide an optical device that is well adapted to form a sealing portion formed of a glass material.

It is a further object of the invention to provide a method for making the optical device.

According to one embodiment of the invention, an optical device comprises:

a substrate;

an optical element mounted on the substrate;

a first glass member sealing the optical element and the substrate; and a second glass member formed on the first glass member and comprising a mold separation property higher than the first glass member.

In the above optical device, the second glass member is formed on the first glass member, so that the first glass member is bonded to the substrate and the second glass member does not contact the substrate. Further, in the optical device, when the hot pressing is performed, the substrate with the optical element mounted thereon is supported on the first mold, and the first glass member and the second glass member are supported on the second mold, and the second glass member positioned on the opposite side of the substrate contacts the second mold, so that the first glass member does not contact the second mold. Thus, the processing conditions required during the hot pressing are temperature, pressure etc. when the first glass member is bonded to the substrate, and temperature, pressure etc. when the second glass member is separated from the second mold. The second glass member has a separation property from the mold higher than that of the first glass member, so that the processing condition can be relaxed as compared to the conventional case where the first glass member is separated from the second mold. Therefore, the range of processing condition during the hot pressing such as temperature of the glass member, pressure applied to the glass member can be widened.

In the above embodiment, the following modifications and changes can be made.

(i) The second glass member further comprises a glass transition temperature higher than the first glass member.

Since the second glass member has a glass transition temperature higher than the first glass member, the second glass member can have a mold separation property higher than the first glass member, so that the processing condition can be relaxed compared to the conventional case where the first glass member is separated from the second mold. Therefore, the range of processing condition during the hot pressing such as temperature of the glass member, pressure applied to the glass member can be widened.

(ii) The substrate, the first glass member and the second glass member comprise a relationship in thermal expansion coefficients thereof that a ratio of the lowest of the thermal expansion coefficients to the highest of the thermal expansion coefficients is not less than 0.85.

(iii) The first glass member comprises a thermal expansion coefficient smaller than the substrate and the second glass member.

(iv) The second glass member comprises an optical surface formed on an outer surface thereof for optically controlling a light to enter into or to be emitted from the optical element.

(v) At least one of the first glass member and second glass member contains a phosphor material to be excited by a light with a predetermined wavelength to emit a wavelength conversion light.

(vi) The phosphor material comprises a phosphor particle.

(vii) The substrate comprises a first conductive pattern formed on a mounting surface of the optical element, a second conductive pattern formed on an opposite side of the mounting surface of the optical element, and a third conductive pattern extending in a thickness direction of the substrate to electrically connect the first conductive pattern and the second conductive pattern.

Thus, when the optical device is fabricated, the glass sealing of plural optical devices can be conducted together by hot pressing a sheet of glass plate, where the optical devices can have plural external terminals, adapted to mass production.

(viii) The optical element comprises a light emitting element.

(ix) The first glass member comprises a refractive index not less than 1.6.

(x) The light emitting element comprises a GaN based LED element comprising a GaN based semiconductor layer formed on a growth substrate.

(xi) The optical element comprises a light receiving element.

According to another embodiment of the invention, a method for making an optical device comprises:

supporting an opposite side of a mounting surface of a substrate with an optical element mounted thereon by a first mold;

supporting a laminate comprising a first plate glass member and a second glass member on a side of the second glass member by a second mold, the second glass member comprising a mold separation property higher than the first glass member; and pressing the first mold against the second mold while rendering the mounting surface of the substrate opposite to the first glass member of the laminate to perform a hot pressing.

In the above method, when the hot pressing is performed, the second glass member side of the laminated body is supported on the second mold, so that the first glass member does not contact the second mold. Thus, the processing conditions required during the hot pressing are temperature, pressure etc. when the first glass member is connected to the substrate, and temperature, pressure etc. when the second glass member is separated from the second mold. The second glass member has a mold separation property higher than the first glass member, so that the processing condition can be relaxed compared to the conventional case where the first glass member is separated from the second mold. Therefore, the range of processing condition during the hot pressing such as temperature of the glass member, pressure applied to the glass member can be widened.

In the above embodiment, the following modifications and changes can be made.

(xii) The second glass member comprises a preformed glass comprising an optical surface preliminarily formed on an opposite side of the first glass member.

ADVANTAGES OF THE INVENTION

According to the invention, the range of the processing conditions during the hot pressing such as temperature of the glass member, pressure applied to the glass member can be widened, so that a sealing portion formed of a glass material can be easily formed. Further, a failure in bonding between the sealing portion and the substrate and adhesion of the sealing portion to the mold can be prevented, so that a decrease in product yield can be suppressed.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
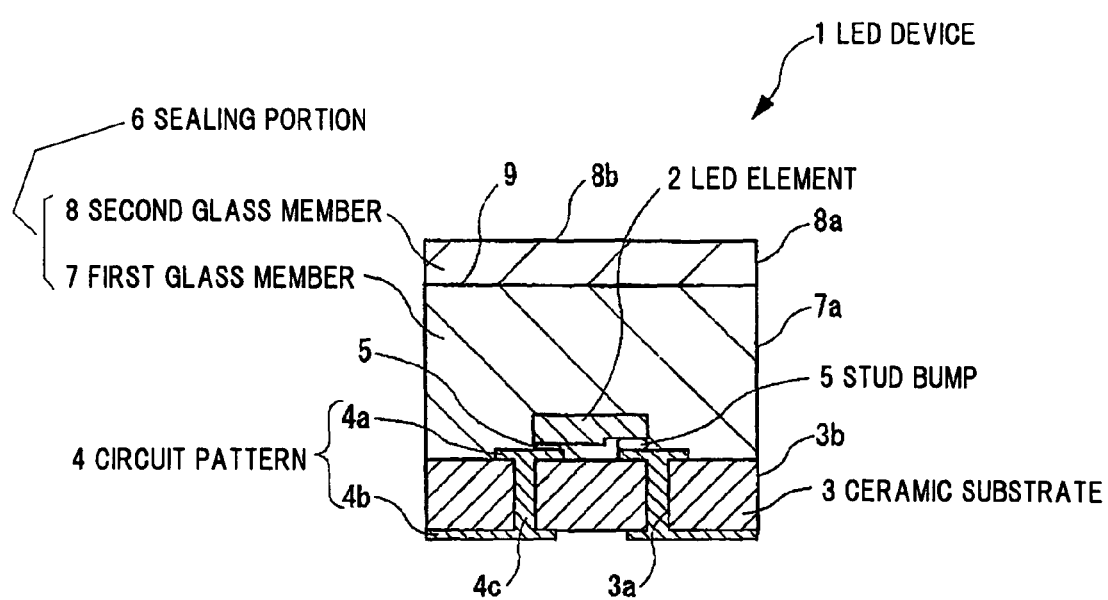
FIG. 1 is a longitudinal cross sectional view schematically showing an LED device in a first preferred embodiment according to the invention.
Figure 2:
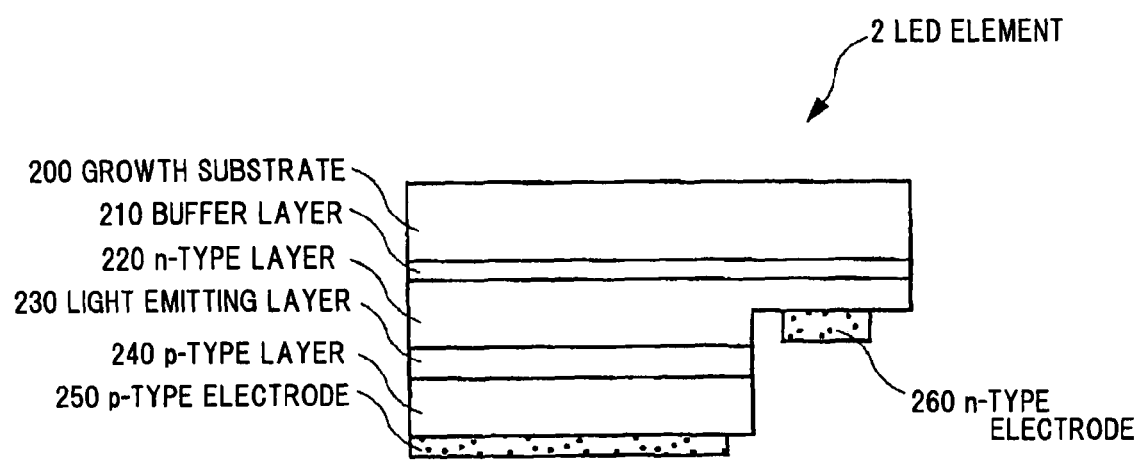
FIG. 2 is a side view schematically showing an LED element in the first preferred embodiment according to the invention.
Figure 3:
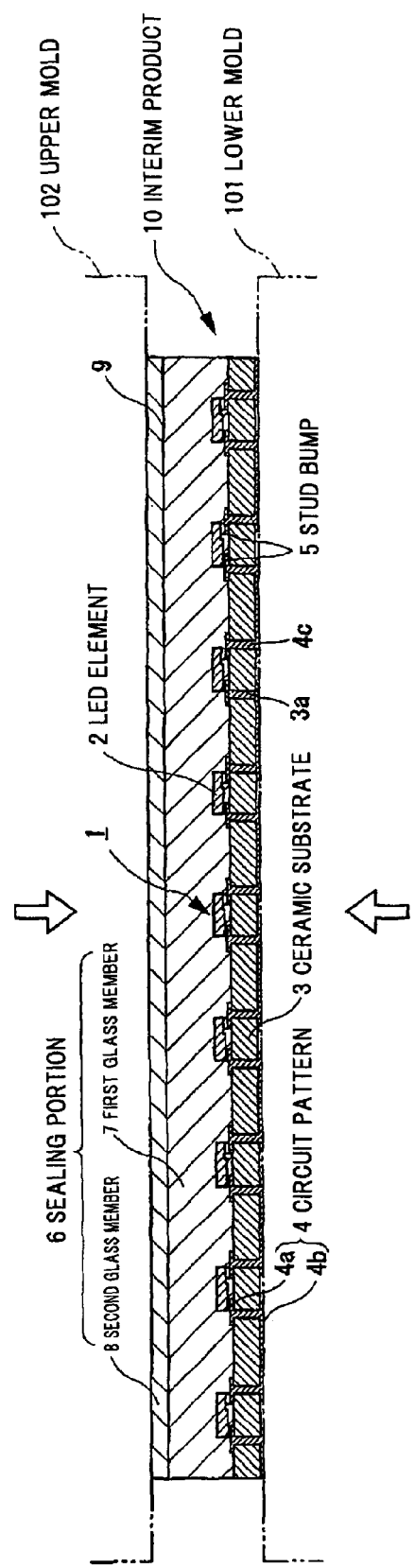
FIG. 3 is an explanatory view schematically showing a condition of hot pressing in the first preferred embodiment according to the invention.

FIGS. 1 to 3 show an LED device in the first preferred embodiment according to the invention, where FIG. 1 is a longitudinal cross sectional view schematically showing the LED device. Further, each of the drawings is a schematic view only for explanation of the invention, so that a relative dimension of each part in the drawings may be different from each other.

Construction of LED Device 1

As shown in FIG. 1, the LED device 1 comprises an LED element 2 as an optical element, a ceramic substrate 3 mounting the LED element 2 thereon, a circuit pattern 4 formed on the ceramic substrate 3 to supply an electrical power to the LED element 2, a stud bump 5 electrically connecting the LED element 2 with the circuit pattern 4, and a sealing portion 6 formed on the ceramic substrate 3 to seal the LED element 2.

FIG. 2 is a schematic side view showing the LED element of the embodiment.

As shown in FIG. 2, the LED element 2 is a flip-chip type and formed of GaN based semiconductor material. The LED element 2 is structured such that a buffer layer 210, an n-type layer 220, a light emitting layer 230, and a p-type layer 240 are sequentially formed on a growth substrate 200 formed of sapphire ($Al_2O_3$) by a crystal growth method. Further, the LED element 2 has a p-type electrode 250 disposed on the surface of the p-type layer 240, and an n-type electrode 260 disposed on a part of the n-type layer 220 exposed by etching a part of the p-type layer 240 through the n-type layer 220. The LED element 2 is formed by an epitaxial growth method at a temperature of not less than 700° C., has an acceptable temperature limit of not less than 600° C., and is proof against a processing temperature in a sealing process using a low melting and heat melting glass described later. The LED element 2 has a thermal expansion coefficient ($\alpha$) of 5 to $7\times10^{-6}/°$ C. In this embodiment, the LED element 2 has a size of 0.34 mm×0.34 mm×0.09 mm (thickness).

The ceramic substrate 3 is made of alumina ($Al_2O_3$) and has a thermal expansion coefficient ($\alpha$) of $7\times10^{-6}/°$ C. The ceramic substrate 3 has a plurality of via holes 3a passing through in the thickness direction, where each of the via holes 3a allows an electrical connection between the circuit pattern 4 metalized on a mounting surface for the LED element 2 and a surface opposite to the mounting surface for the LED element 2. In this embodiment, the ceramic substrate 3 has a thickness of 0.25 mm.

The circuit pattern 4 is formed of tungsten (W)—nickel (Ni)—gold (Au). The circuit pattern 4 has a first conductive pattern 4a disposed on the mounting side of the LED element 2 and a second conductive pattern 4b disposed on the back side of the mounting side. A third conductive pattern 4c of tungsten (W) is formed in the via holes 3a to allow electrical connection between the conductive patterns 4a, 4b.

The sealing portion 6 has a first glass member 7 sealing the LED element 2 formed on the ceramic substrate 3, and a second glass member 8 formed on the first glass member 7. Both of the first glass member 7 and second glass member 8 have humidity resistance.

The first glass member 7 is formed of, e.g., ZnO based heat melting glass, and is formed a rectangular parallelepiped on the ceramic substrate 3. Herein, the heat melting glass is defined as a glass material produced through a melt state or softened state thereof by heat melting, and is different from a glass produced by a sol-gel method. The sol-gel glass widely changes in volume in the production process and tends to generate cracks so that it is difficult to form a thick glass film. In contrast, the heat melting glass can eliminate the problem described above. Further, the sol-gel glass tends to generate fine pores therein so that airtightness thereof may be reduced. In contrast, the heat melting glass does not cause the problem so that the LED element 2 can be sealed securely. In this embodiment, the first glass member 7 is made of $B_2O_3$—$SiO_2$—ZnO—$Nb_2O_5$ based glasses, but may be made of glasses with another composition. In particular, the first glass member 7 has a glass transition temperature (Tg) of 485° C. and a yielding point (At) of 517° C. Thus, the glass transition temperature (Tg) is sufficiently lower than the formation temperature of the epitaxial growth layer of the LED element 2. In this embodiment, the glass transition temperature (Tg) is 200° C. or more lower than the formation temperature of the epitaxial growth layer. Thus, the first glass member 7 can adhere to the ceramic substrate 3, so that the hot pressing can be achieved. Further, the first glass member 7 has a thermal expansion coefficient ($\alpha$) of $6\times10^{-6}/°$ C. at 100° C. to 300° C. Further, when the temperature exceeds the glass transition temperature (Tg), the thermal expansion coefficient ($\alpha$) becomes higher than that of the above case. The first glass member 7 has a thickness of 0.5 mm, and a refractive index of 1.7.

The second glass member 8 is made of, e.g., SiO—$B_2O_3$ based heat melting glass, and is formed a rectangular parallelepiped on the first glass member 7. The second glass member 8 has a higher glass transition temperature (Tg) and a higher mold separation property (i.e., a separation property from a mold) higher than the first glass member 7. In particular, the second glass member 8 has a glass transition temperature (Tg) of 560° C. Further, the second glass member 8 has thermal properties such as a glass transition temperature (Tg) higher than the first glass member 7, and it has the other properties such as humidity resistance, acid resistance, alkali resistance higher than the first glass member 7. Further, the second glass member 8 may be made of SiO—$B_2O_3$ based glass, SiO—$B_2O_3$—$Al_2O_3$ based glass, SiO—$Al_2O_3$ based glass, SiO—$R_2O$ (R is Li, Na, K etc.) based glass, or a glass with another composition. Generally, in glass materials, the higher the thermal properties are, the higher the humidity resistance, acid resistance, alkali resistance are. The second glass member 8 has a thickness of 0.15 mm and a thermal expansion coefficient ($\alpha$) of $7\times10^{-6}/°$ C. at 100° C. to 300° C. When the temperature exceeds the glass transition temperature (Tg), the thermal expansion coefficient ($\alpha$) becomes higher than the above case. The second glass member 8 has a refractive index of 1.5. The upper surface 8b of the second glass member 8 is formed parallel to the mounting surface of the ceramic substrate 3.

As shown in FIG. 1, the first glass member 7 and second glass member 8 are laminated on the ceramic substrate 3. The side surfaces of the ceramic substrate 3, the first glass member 7 and the second glass member 8 are aligned with each other to form one surface. Thus, the LED device 1 has a rectangular parallelepiped-like appearance as a whole. Further, the interface 9 between the first glass member 7 and the second glass member 8 forms a horizontal line in longitudinal section.

In this embodiment, the thermal expansion coefficients ($\alpha$) of the first glass member 7 and the second glass member 8 are each set to be substantially equal to that of the ceramic substrate 3, so as to prevent generation of cracks due to stress caused by temperature change from the bonding temperature to room temperature. It is preferred that, when the glass members 7, 8 and the ceramic substrate 3 are several tens mm in width, the thermal expansion coefficients ($\alpha$) thereof satisfy that the ratio of the lowest one to the highest one is not less than 0.85. "substantially equal" about the thermal expansion coefficients ($\alpha$) means that they fall within the above ratio range. In considering that the thermal expansion coefficient ($\alpha$) increases as the temperature exceeds the glass transition temperature (Tg) as described above, it is preferred that the first glass member 7 with the lowest glass transition temperature (Tg) is made to have a thermal expansion coefficient ($\alpha$) equal to or slightly lower than that of the first glass member 8 to minimize the remaining stress.

In the LED device 1 thus composed, the second glass member 8 is disposed on the first glass member 7, so that the first glass member 7 is bonded to the ceramic substrate 3 and the second glass member 8 does not contact the ceramic substrate 3. In the hot pressing, the ceramic substrate 3 with the LED element 2 mounted thereon is supported by a lower mold (=first mold) 101, the plate glass members 7, 8 are supported by an upper mold (=second mold) 102, and the second glass member 8 located on the opposite side of the ceramic substrate 3 contacts the upper mold 102, so that the first glass member 7 does not contact the upper mold 102.

Method of making LED device 1

A method for making the LED device 1 will be detailed below.

First, the ceramic substrate 3 with via holes 3a is provided, and W-paste is screen-printed on the ceramic substrate 3 according to a circuit pattern 4.

Then, the ceramic substrate 3 with the W-paste screen-printed thereon is heated at about 1000° C. to burn the W into the ceramic substrate 3, and Ni and Au are plated on the W to form the circuit pattern 4. Then, the plural LED elements 2 are electrically connected to a first conductive pattern 4a of the circuit pattern 4 of the ceramic substrate 3 by stud bumps 5.

Then, the ceramic substrate 3 with the LED elements 2 mounted thereon is disposed on the lower mold 101 as a first mold, and the first and second plate glass members 7, 8 are disposed on the upper mold 102 as a second mold. The lower mold 101 and the upper mold 102 are each provided with a heater which can control separately the temperature of the lower mold 101 and the upper mold 102. Then, as shown in FIG. 3, the hot pressing is conducted such that the lower mold 101 and the upper mold 102 are pressed to each other while rendering the first glass member 7 opposite to the mounting surface of the ceramic substrate 3 in a nitrogen atmosphere.

In this embodiment, the hot pressing is conducted at a processing pressure of about 20 to 40 kgf/cm$^2$. The hot pressing only needs to be conducted in an inert atmosphere for the components, and may be conducted, e.g., in vacuum other than the nitrogen atmosphere. FIG. 3 is an explanatory view schematically showing a condition of the hot pressing. In this processing, the first glass member 7 has a viscosity of $10^5$ to $10^9$ poise, and is joined with the ceramic substrate 3 through oxides contained therein.

Thus, the ceramic substrate 3 and the first glass member 7 are joined based on the chemical bonding through the oxides, so that the sealing strength can be enhanced. Therefore, even a small package with a small bonding area can be realized. Further, the sealing portion 6 of the glass material is processed by the hot pressing at a high viscosity, so that the processing can be conducted at a sufficiently low temperature as compared to the crystal growth temperature of the LED element 2.

Further, the first plate glass member 7 and the ceramic substrate 3 are set in parallel and the hot pressing is conducted at a high viscosity, so that the first glass member 7 can move in parallel to the surface of the ceramic substrate 3 and contact tightly to it in a face-to-face condition, and generation of voids can be prevented during the sealing of the LED element 2.

In case of glasses, even if temperature thereof exceeds the yielding point (At) by several tens of degrees (° C.), viscosity thereof does not lower to the level of general sealing resins. If viscosity thereof intentionally lowers to the level of general sealing resins, the sealing and molding become difficult since temperature thereof may exceed the crystal growth temperature of the LED element 2, or flowing of softened glass may occur although the glass may not be adhered to the mold. Therefore, it is preferred that the hot pressing is conducted at a viscosity not less than $10^4$ poise.

Then, the lower mold 101 and the upper mold 102 are separated from the ceramic substrate 3 and the second glass member 8, respectively. The second glass member 8 has a glass transition temperature (Tg) lower than the first glass member 7 and a separation property from the upper mold 102 higher than the first glass member 7, so that it can be smoothly separated from the upper mold 102. In this embodiment, since the hot pressing is conducted at about 600° C., the second glass member 8 with a glass transition temperature (Tg) of 560° C. is not completely softened and does not adhere to the upper mold 102. Thus, the upper surface 8b of the second glass member 8 can be formed into a desired form.

In this case, the first glass member 7 has a nearer thermal expansion coefficient to the ceramic substrate 3 than the other material such as resin, so that adhesion failure such as separation and crack is difficult to cause even if they are cooled down to room temperature or low temperature after bonded at high temperature. In addition, since glass materials hardly generate cracks by compression stress although easily generate cracks by tensile stress, the first glass member 7 is set to have a thermal expansion coefficient lower than the ceramic substrate 3.

Further, the first and second glass members 7, 8 have a nearer thermal expansion coefficient to the LED element 2 than the other material such as resin, the thermal expansion coefficients of the entire components including the ceramic substrate 3 become close to each other, so that internal stress is difficult to generate even when there is a temperature difference between high temperature in the glass sealing process and room temperature. Therefore, stable workability can be obtained without generating cracks. Further, since the internal stress can be thus reduced, impact resistance can be enhanced to have a glass sealing type LED with high reliability.

In order to shorten the cycle time of the hot pressing, a preheating stage may be set before the pressing so as to preheat the glass members 7, 8, and a slow cooling stage may be set after the pressing so as to control the cooling speed of the glass members 7, 8. Alternatively, the pressing may be conducted on the preheating stage and the slow cooling stage, where the process of the hot pressing can be appropriately changed.

According to the process described above, an interim product 10 as shown in FIG. 3 can be obtained that the plural of LED devices 1 are arrayed connected in the horizontal direction. Then, the ceramic substrate 3 with the sealing portion 6 is placed on a dicer, where the ceramic substrate 3 is diced to separate the LED elements 2 from each other, so that each of the LED devices 1 can be completed. Meanwhile, by cutting together the sealing portion 6 and the ceramic substrate 3 by the dicer, as described above, the side surfaces 3b, 7a, 8a of the ceramic substrate 3, the first glass member 7 and the second glass member 8, respectively, can be aligned with each other to form one surface.

Advantages of the First Embodiment

As described above, the LED device 1 of the first embodiment is, during the hot pressing, subjected to the two processing conditions, i.e., one being temperature, pressure etc. when the first glass member 7 is bonded to the ceramic substrate 3, and the other being temperature, pressure etc. when the second glass member 8 is separated from the upper mold 102. Thus, the bonding to the ceramic substrate 3 and the separation from the upper mold 102 are conducted by the different glass members 7 and 8, respectively. Therefore, the first glass member 7 can be a material suitable for the connection to the ceramic substrate 3 during the hot pressing, and the second glass member 8 can be a material suitable for the separation from the upper mold 102 during the hot pressing. In this embodiment, since the second glass member 8 has a higher glass transition temperature and a higher mold separation property than the first glass member 7, the processing conditions can be relaxed compared to the conventional case where the first glass member 7 is separated from the upper mold 102.

Therefore, the range of processing conditions during the hot pressing such as temperature, pressure of the glass members 7, 8 can be widened.

For example, by checking the temperature of the processing conditions, it is confirmed that the acceptable temperature range during the hot pressing is only 10° C. to 30° C. when the sealing portion 6 is formed of only the first glass member 7. In contrast, the acceptable temperature range during the hot pressing can be widened 50° C. or more when the sealing portion 6 is formed of the first glass member 7 and the second glass member 8 as embodied in this embodiment.

Therefore, according to the LED device 1 of this embodiment, the sealing portion 6 with the glass members 7, 8 can be easily molded. Further, failure in connection between the sealing portion 6 and the ceramic substrate 3 and adhesion of the sealing portion 6 to the upper mold 102 can be prevented, so that decrease in process yield can be suppressed.

Further, in the LED device 1 of this embodiment, at the upper portion of the sealing portion 6, the second glass member 8 is disposed that has humidity resistance, acid resistance, alkali resistance, etc. higher than the first glass member 7. Thus, the second glass member 8 is disposed at the upper portion of the sealing portion 6 where the amount of external light emission from the LED elements 2 is relatively large, so that deterioration of the upper portion of the sealing portion 6 can be inhibited effectively and time deterioration in amount of light emission of the LED device 1 can be suppressed.

In general, the light extraction efficiency from the LED element 2 increases according as the refractive index of the sealing member for the LED element 2 increases. In this embodiment, the sealing member can be the glass material with a refractive index (not less than 1.6) higher than that of an epoxy resin with a high refractive index of resin materials generally used as a sealing material for the LED element. Thereby, light extraction efficiency can be enhanced compared to a conventional LED element using the sealing resin. Further, in the resin material, prevention of deterioration in transparency caused by light or heat and increase in refractive index is difficult to have simultaneously, but in the glass material, they can be simultaneously obtained.

By using the ceramic substrate 3 formed of alumina, the parts cost can be reduced. Since the alumina is readily available, the mass productivity of the LED device 1 can be enhanced and the production cost can be reduced. Further, since the alumina has a relatively good thermal conductivity, it can be sufficiently adapted to LED devices with large emission and high output. Furthermore, since the alumina has a relatively small light absorption, it is advantageous in light extraction efficiency.

Since the LED element 2 is flip-chip mounted, no bonding wires are needed where electrical connection failure does not occur even when the hot pressing is conducted in a high-viscosity condition. In other words, viscosity of the glass material during the sealing process is as high as $10^5$ to $10^9$ poise and is significantly different from about 5 poise of liquid epoxy resins before hardening. If a face-up type LED element is sealed with the glass material, crash or deformation of wire may occur during the glass sealing process when an electrode on the surface of the LED element is electrically connected through the wire to power supplying members such as a lead. However, the flip-chip mounted LED element 2 can avoid this problem.

Further, the second conductive pattern 4b on the ceramic substrate 3 is drawn through the via holes 3a to the back side so that the process flow can be simplified since special countermeasures are not required against the penetration of the glass material into unnecessary sites or the coating of the glass material around the electrical terminals. In addition, the plural LED elements 2 can be simultaneously sealed with the plate glass material, and the plural LED devices 1 can be easily mass-produced by dicing.

In general, the mold separation property of a molded material is not determined only by the glass transition temperature (Tg) and it can be affected by the relationship between the mold material and the molded material, i.e., the glass material. For example, fluoride glasses have an adhesion property to stainless-steel lower than the other glass materials. Therefore, the mold material or the glass material can be suitably chosen to make a difference in the mold separation property between the first glass member 7 and the second glass member 8.

Second Embodiment

Figure 4:
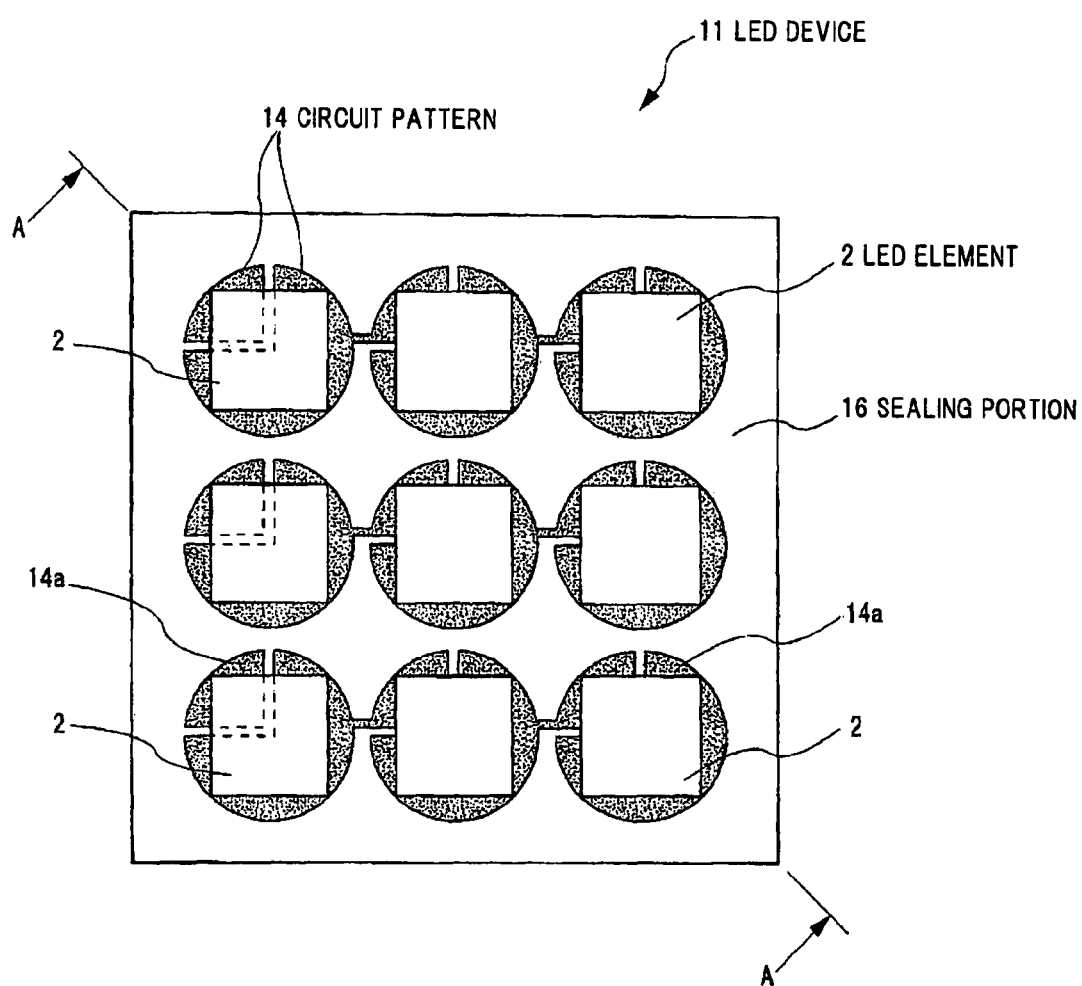
FIG. 4 is a plan view schematically showing an LED device in a second preferred embodiment according to the invention.
Figure 5:
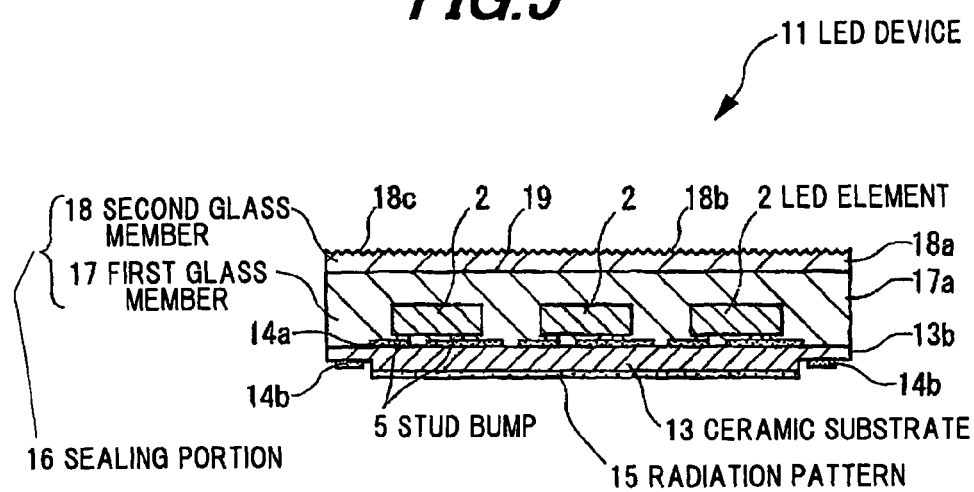
FIG. 5 is a schematic cross-sectional view taken along a line A-A in FIG. 4.
Figure 6:
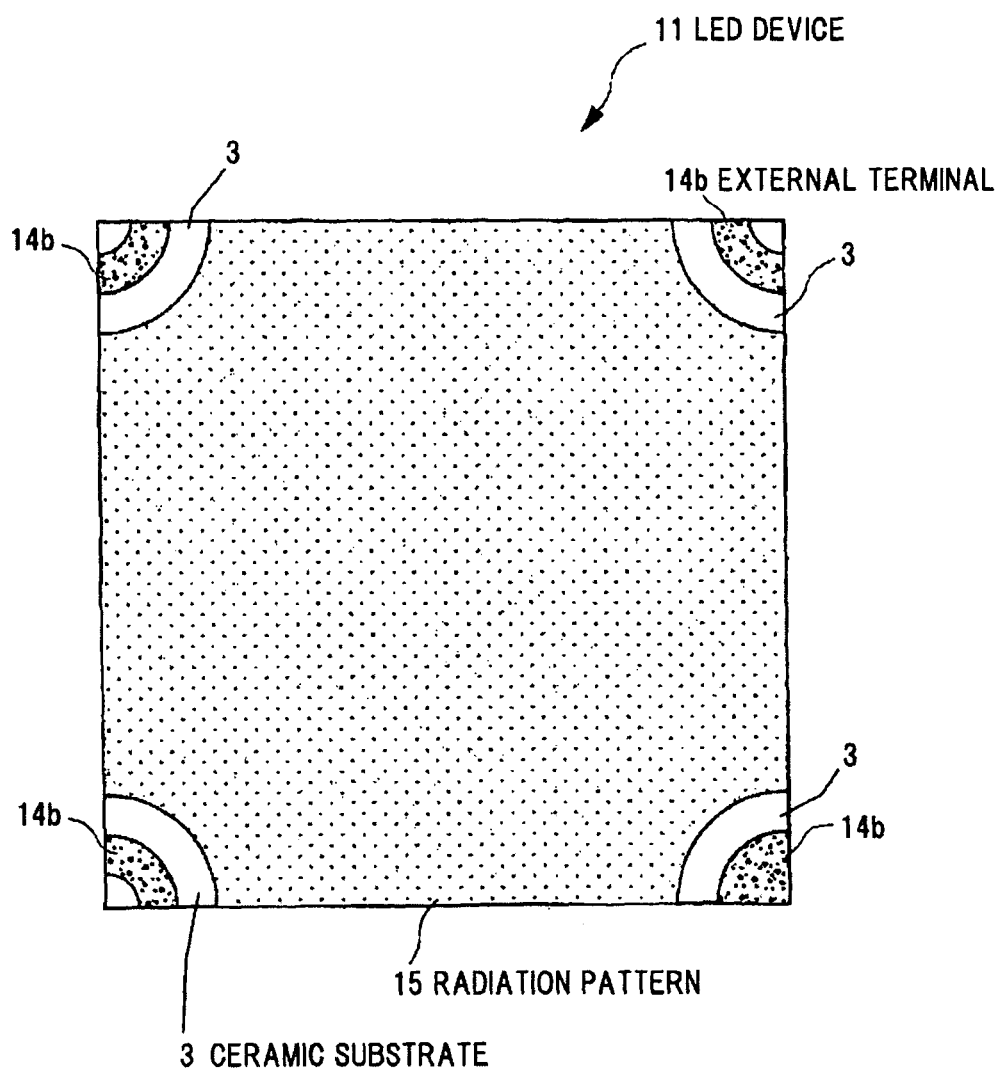
FIG. 6 is a bottom view schematically showing the LED device in the second preferred embodiment according to the invention.

FIGS. 4 to 6 show the second preferred embodiment according to the invention, FIG. 4 is a schematic plain view showing an LED device of the second embodiment, FIG. 5 is a schematic cross-sectional view taken along a line A-A in FIG. 4. In FIGS. 4-6, like components are indicated by the same numerals as used in the first embodiment, and the explanation thereof is appropriately omitted.

As shown in FIG. 4, the LED device 11 of this embodiment is different from that of the first preferred embodiment in that it has plural LED elements 2. As shown in FIGS. 4, 5, the LED device 11 comprises the plural flip-chip type GaN based LED elements 2, a ceramic substrate 13 with a multilayer structure, formed a square in a plain view, and on which the LED elements 2 are mounted, and a circuit pattern 14 formed of tungsten (W) on the surface or inside of the ceramic substrates 13. As shown in FIG. 5, the LED device 11 further comprises stud bumps 5 electrically connecting the LED elements 2 to the circuit pattern 14, and a sealing portion 16 composed of a first glass member 17 and a second glass member 18, sealing the LED elements 2, and connected to the ceramic substrate 13.

The circuit pattern 14 is composed of a first conductive pattern 14a disposed on the mounting side of the LED element 2 and a second conductive pattern (not shown) formed on the opposite side of the mounting side of the LED element 2. External terminals 14b electrically connected to the LED elements 2 are formed on the opposite side of the mounting side of the ceramic substrate 13. In plane of the ceramic substrate 13, the LED elements 2 (340 μm square) are arranged in 3 chips×3 chips in length and width, where 9 chips in total are densely mounted through the stud bumps 5 such that the distance between each other in length and width becomes 600 μm. As shown in FIG. 4, the first conductive pattern 14a is formed for each LED element 2 to have a circular outline in a plain view. As shown in FIG. 6, the external terminals 14b are exposed as an intermediate layer at the four corners of the back surface of the ceramic substrate 13. FIG. 6 is a schematic bottom view showing the LED device.

Further, the LED device 11 has a heat radiation pattern 15 formed on the back surface of the ceramic substrate 13 so as to externally radiate heat generated from the LED elements 2. The heat radiation pattern 15 is formed to be electrically isolated from the external terminals 14b.

The ceramic substrate 13 has a multilayer structure including an interlayer wiring formed of W, where as shown in FIG. 4, a group of three LED elements is formed by connecting lateral three LED elements 2 in series. The ceramic substrate 13 is formed such that the anode of the group of the LED elements 2 is connected to one of the external terminals 14b and the cathode of the group of the LED elements 2 is connected to the external terminal 14*b*. In detail, the anode external terminals 14*b* are formed at three of the four corners on the back side of the ceramic substrate 13, and the cathode external terminal 14*b* is formed at the remaining one of the four corners. The anodes of the three groups of LED elements are each connected to each of the anode external terminals 14*b*. Further, the cathodes of the three groups of LED elements are all connected to the cathode external terminal 14*b*.

The first glass member 17 seals all of the LED elements 2 mounted on the ceramic substrate 13. The first glass member 17 is made of, e.g., ZnO based heat melting glass, and formed a rectangular parallelepiped on the ceramic substrate 13. For example, the first glass member 17 has a glass transition temperature (Tg) of 485° C. and a yielding point (At) of 517° C. The first glass member 17 has a thickness of 0.5 mm.

The second glass member 18 is made of, e.g., $SiO—B_2O_3$ based heat melting glass, and formed a rectangular parallelepiped on the first glass member 17. For example, the second glass member 18 has a glass transition temperature (Tg) of 560° C. The second glass member 18 has a thickness of 0.2 mm. As shown in FIG. 5, the second glass member 18 has a roughened surface portion 18*c* with a predetermined roughness formed on the whole of an upper surface 18*b* by omitting the mirror-finishing on one surface thereof. The second glass member 18 uses a preformed glass in which the roughened surface portion 18*c* is preliminarily molded before the hot pressing.

As shown in FIG. 5, the first glass member 17 and the second glass member 18 are laminated on the ceramic substrate 13. The side surfaces 13*b*, 17*a*, 18*a* of the ceramic substrate 13, the first glass member 17 and the second glass member 18, respectively, are aligned with each other to form one surface. Thus, the LED device 1 is formed a rectangular parallelepiped which is longer in horizontal direction than in thickness direction as a whole. The interface 19 between the first glass member 17 and the second glass member 18 forms a horizontal line in longitudinal section.

In the LED device 11 thus structured, the second glass member 18 is disposed on the first glass member 17, so that the first glass member 17 is bonded to the ceramic substrate 13 and the second glass member 18 does not contact the ceramic substrate 3. In the hot pressing, the ceramic substrate 13 with the LED elements 2 mounted thereon is supported by the lower mold 101, and the plate glass members 17, 18 are supported by the upper mold 102, so that the second glass member 18 contacts the upper mold 102 and the first glass member 17 does not contact the upper mold 102.

In the LED device 11, the plural LED elements 2 are sealed together, so that, if the sealing portion 16 is formed long in horizontal direction and the upper surface of sealing portion 16 is formed planar, light emitted from the LED elements 2 may be totally reflected thereon to enter the ceramic substrate 13 etc. and to cause optical loss. However, in this embodiment, since the roughened surface portion 18*c* is formed on the upper surface 18*b* of the second glass member 18, decrease in light extraction efficiency can be suppressed. In particular, the decrease in light extraction efficiency can be significantly suppressed in the case that the horizontal length of the sealing portion 16 is formed enough long so that, of light emitted radially from the LED elements 2, a light component with an angle to the ceramic substrate 13 smaller than a critical angle (θ) at the upper surface of the second glass member 18 can enter the upper surface 18*b* of the second glass member 18. For example, provided that the critical angle and the thickness of the sealing portion 16 are (θ) and (h), respectively, when the distance from the LED element 2 to the side surface 18*a* of the second glass member 18 in a top view is larger than 2 tan θ, the light extraction efficiency can be significantly enhanced.

The LED device 1 of the second embodiment is, during the hot pressing, also subjected to the two processing conditions, i.e., one being temperature, pressure etc. when the first glass member 17 is bonded to the ceramic substrate 13, and the other being temperature, pressure etc. when the second glass member 18 is separated from the upper mold 102. Thus, the range of processing conditions during the hot pressing such as temperature, pressure of the glass members 17, 18 can be widened.

Therefore, the sealing portion 16 composed of the glass members 17, 18 can be easily formed. Further, a failure in connection between the sealing portion 16 and the ceramic substrate 13 and adhesion of the sealing portion 16 to the upper mold 102 can be prevented, so that a decrease in process yield can be suppressed. Further, the second glass member 18 uses the preformed glass, so that the sealing process can be conducted without adjusting the roughness of the roughened surface portion 18*c*.

Although the LED device 11 of this embodiment is structured such that the plural LED elements 2 are densely mounted, the thermal expansion coefficients (α) of the LED element 2 and the sealing portion 16 are substantially equal to each other, so that the LED device 11 can have high reliability without generating cracks. Also, the ceramic substrate 13 and the first glass member 17 are substantially equal in thermal expansion coefficient, so that the LED device 11 can have good glass adhesive strength.

Since the LED device 11 of this embodiment has the ceramic substrate 13, although the GaN based LED elements 2 to generate much heat are densely mounted, the heat radiation property can be kept stable. Also, a serial parallel circuit pattern can be easily formed and a wiring in the electrolysis plating can be easily formed.

Furthermore, since the LED device 11 of this embodiment is constructed such that the external electrical terminals are drawn from the intermediate layer and the heat radiation pattern 15 is formed on the bottom surface, heat generated during the operation of the nine LED elements 2 disposed densely can be rapidly dissipated from the heat radiation pattern 15 to a heat sink (not shown) etc.

Third Embodiment

Figure 7:
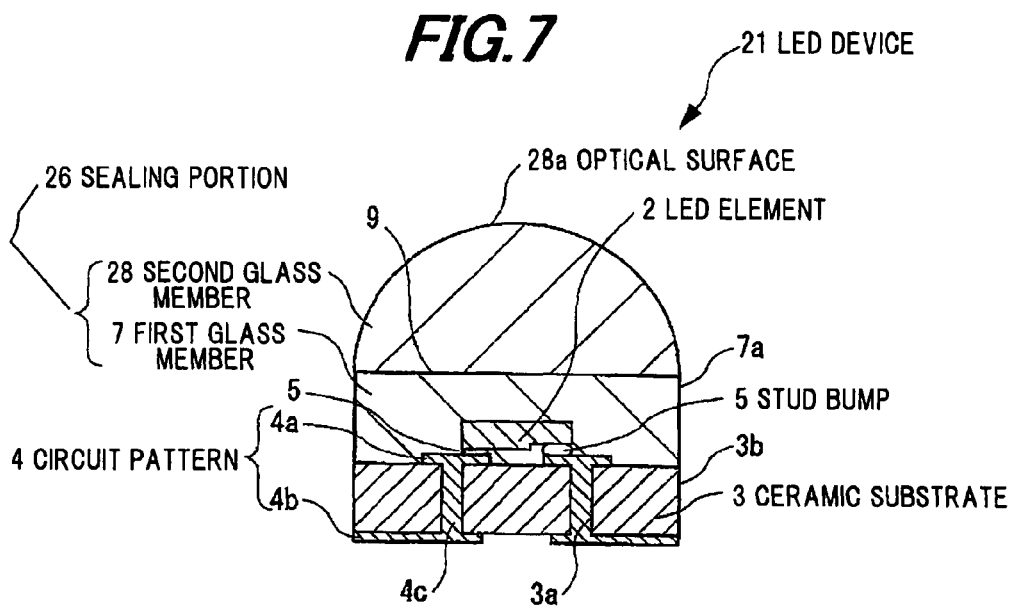
FIG. 7 is a longitudinal cross sectional view schematically showing an LED device in a third preferred embodiment according to the invention.

FIG. 7 is a schematic cross sectional view showing an LED device in the third preferred embodiment according to the invention. In FIG. 7, like components are indicated by the same numerals as used in the first embodiment, and the explanation thereof is appropriately omitted.

As shown in FIG. 7, the LED device 21 has a sealing portion 26 with a second glass member 28 different in shape from the first embodiment. The sealing portion 26 is composed of the first glass member 7 sealing the LED element 2, formed on the ceramic substrate 3 and the second glass member 28 formed on the first glass member 7. The first glass member 7 is made of, e.g., ZnO based heat melting glass, and formed a rectangular parallelepiped on the ceramic substrate 3. For example, the first glass member 7 has a glass transition temperature (Tg) of 485° C. and a yielding point (At) of 517° C. The first glass member 7 has a thickness of 0.5 mm.

The second glass member 28 is made of, e.g., $SiO—B_2O_3$ based heat melting glass, and formed, on the first glass member 7, a semicircle being convex upward in cross-sectional view. The second glass member 28 has an optical surface 28*a* on the outer side thereof, so that the critical angle of light emitted radially from the LED element 2 can be large. The optical surface 28a forms a curved portion to refract light emitted from the LED element 2 in a predetermined direction so as to optically control the light. The second glass member 28 has a diameter equal to the horizontal length of the first glass member 7 in cross-sectional view as shown in FIG. 7, and the end portion of the optical surface 28a is continuously connected to the side surface 7a of the first glass member 7. The second glass member 28 has a glass transition temperature (Tg) of 560° C.

The second glass member 28 uses a preformed glass in which the optical surface 28a is preliminarily molded. The preformed glass is used in the hot pressing to be thermally compressed to the first glass member 7.

The LED device 21 thus structured can enhance the light extraction efficiency from the LED element 2. The optical surface 28a is formed in the second glass member 28 independent of the first glass member 7 connected to the ceramic substrate 3, so that the optical surface 28a can be easily formed in the production of the device.

Figure 8:
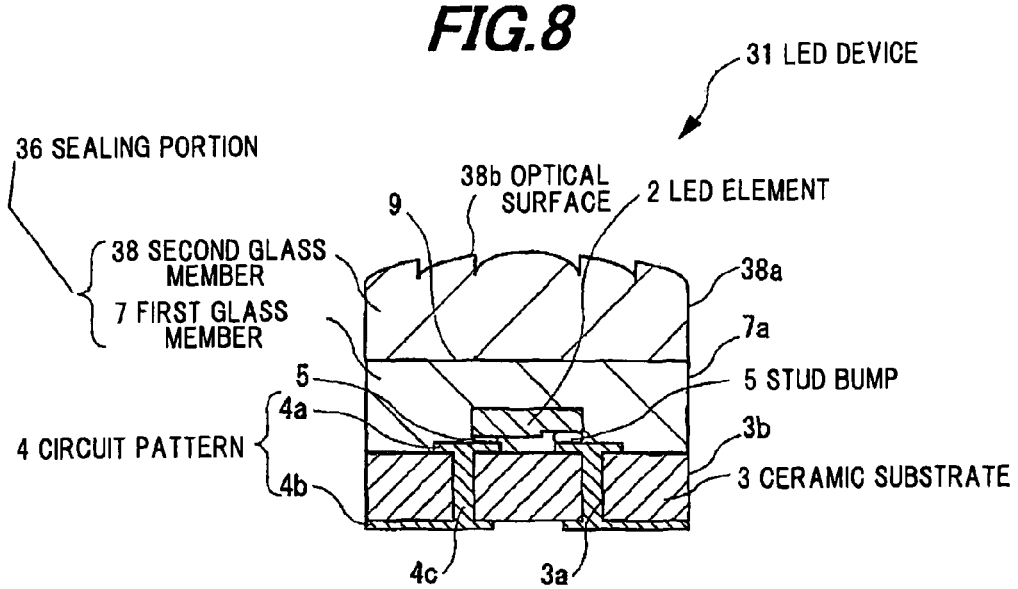
FIG. 8 is a longitudinal cross sectional view schematically showing a modification of the LED device in the third preferred embodiment according to the invention.

Although the third embodiment shows a case that the second glass member 28 has the optical surface 28a formed a semicircle in a cross-sectional view, for example, as shown in FIG. 8, the second glass member 38 of the sealing portion 36 may have an optical surface 38b formed a Fresnel lens. In the LED device 31, the side surfaces 38a of the second glass member 38 are aligned with the side surfaces 7a of the first glass member 7 to form one surface, and the upper surface thereof forms the optical surface 38b. Thus, light emitted radially from the LED element 2 is refracted into a direction perpendicular to the ceramic substrate 3 when it passes through the optical surface 38b, so that the amount of light with an axis perpendicular to the ceramic substrate 3 can be increased. As described above, the shape of the optical surface 38b can be appropriately changed from various standpoints such as light extraction efficiency and the amount of light along the axis perpendicular to the ceramic substrate 3.

Fourth Embodiment

Figure 9:
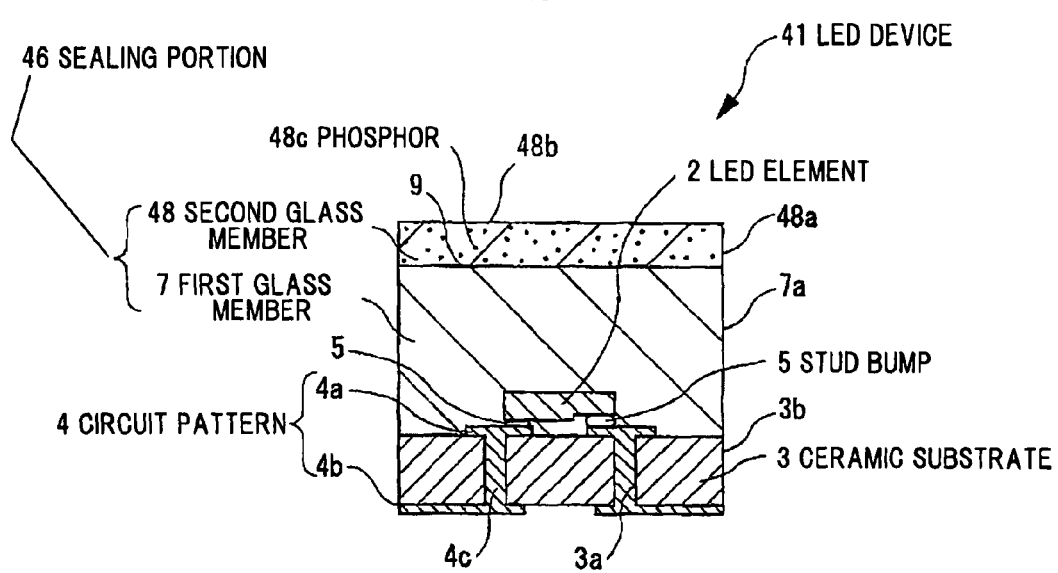
FIG. 9 is a longitudinal cross sectional view schematically showing an LED device in a fourth preferred embodiment according to the invention.

FIG. 9 is a schematic cross sectional view showing an LED device in the fourth preferred embodiment according to the invention. In FIG. 9, like components are indicated by the same numerals as used in the first embodiment, and the explanation thereof is appropriately omitted.

As shown in FIG. 9, the LED device 41 is different from the first preferred embodiment in that it has a sealing portion 46 with a second glass member 48 containing phosphor particles 48c. The sealing portion 46 is composed of the first glass member 7 sealing the LED element 2, formed on the ceramic substrate 3 and a second glass member 48 formed on the first glass member 7. The first glass member 7 is made of, e.g., ZnO based heat melting glass, and formed a rectangular parallelepiped on the ceramic substrate 3. For example, the first glass member 7 has a glass transition temperature (Tg) of 485° C. and a yielding point (At) of 517° C. The first glass member 17 has a thickness of 0.5 mm.

The second glass member 48 contains the phosphor particles 48c, and it is made of, e.g., SiO—$B_2O_3$ based heat melting glass, and formed on the first glass member 7 in a rectangular parallelepiped shape. The side surfaces 48a of the second glass member 48 are aligned with the side surfaces 7a of the first glass member 7 to form one surface, and the upper surface 48b of the second glass member 48 is formed to be parallel to the mounting surface of the ceramic substrate 3.

The second glass member 48 has a glass transition temperature (Tg) of 600° C. The second glass member 48 has a thickness of 0.2 mm.

The phosphor 48c emits wavelength conversion light when being excited by blue light emitted from the LED element 2. The phosphor 48c includes, e.g., YAG (Yttrium Aluminum Garnet) based and BOS (Barium Ortho-Silicate) based phosphors.

According to the LED device 41 thus constructed, the phosphor 48c converts a part of light emitted from the LED elements 2 into yellow light, and the blue light and the yellow light are combined to produce white light.

Figure 10:
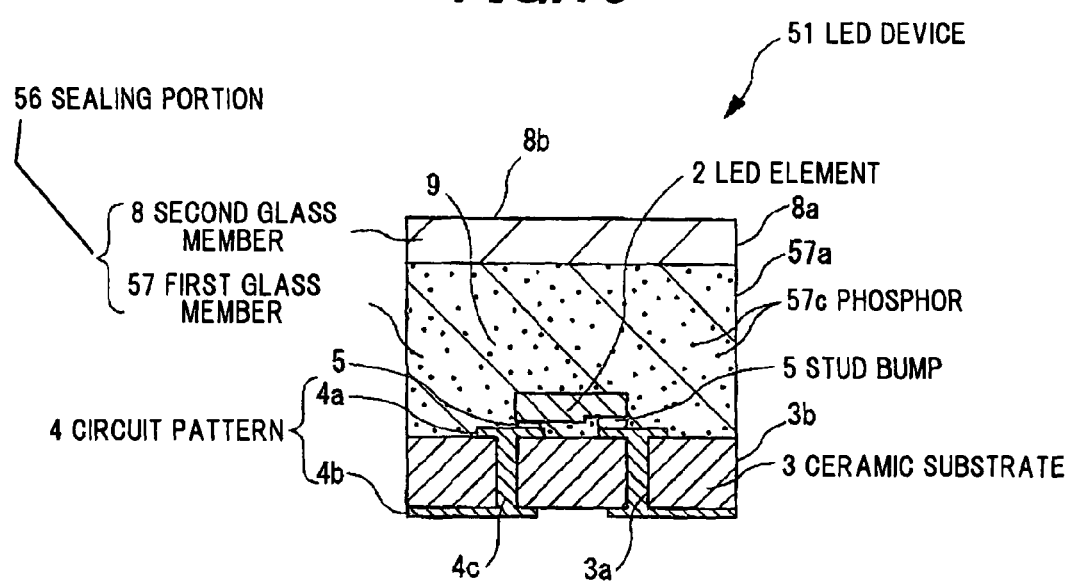
FIG. 10 is a longitudinal cross sectional view schematically showing a modification of the LED device in the fourth preferred embodiment according to the invention.

Although the fourth embodiment shows a case that the second glass member 48 contains the phosphor 48c, for example, as shown in FIG. 10, an LED device 51 may be constructed such that a first glass member 57 of a sealing portion 56 contains a phosphor 57c. In the LED device 51, the side surfaces 57a of the first glass member 57 are aligned with the side surfaces of the second glass member 8 and the ceramic substrate 3 to form one surface. The LED device 51 can also produce white light. Further, both of the first glass member 57 and the second glass member 8 may contain the phosphor.

Figure 11:
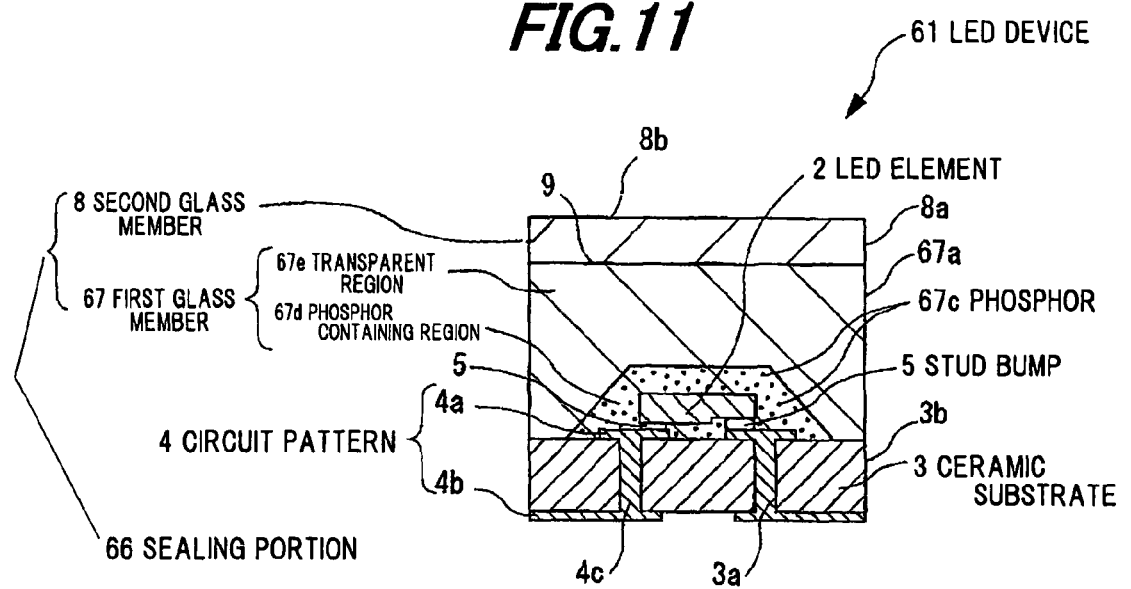
FIG. 11 is a longitudinal cross sectional view schematically showing another modification of the LED device in the fourth preferred embodiment according to the invention.

In addition, as shown in FIG. 11, an LED device 61 can be constructed such that a first glass member 67 of a sealing portion 66 is composed of a phosphor containing region 67d containing phosphor 67c and a transparent region 67e not containing phosphor 67c. In the LED device 61, side surfaces 67a of the first glass member 67 are aligned with the side surfaces of the second glass member 8 and the ceramic substrate 3 to form one surface. The LED device 61 has a structure that the LED element 2 is sealed with the phosphor containing region 67d to decrease a variation in distance between the outer surface of the phosphor containing region 67d and the LED element 2. In the LED device 61, during the hot pressing the phosphor containing region 67d is formed by melt-solidification of powdery glass material and phosphor, and the transparent region 67e uses a preformed glass in which an interface between the phosphor containing region 67d is preliminarily molded. Thus, light emitted radially from the LED element 2 can be uniformly wavelength-converted regardless of the light path, so that white light can be obtained without generating color unevenness. Although in FIG. 11 the phosphor containing region 67d has an outer surface formed in an angular shape in cross-sectional view, the outer surface may be formed in a semicircular shape.

Although in the fourth embodiment, the phosphor particles 48c are used as a phosphor material contained in the second glass member 48, a phosphor complex may be used as the phosphor material in the second glass member 48.

Although in the fourth embodiment, white light is obtained by combining blue light and yellow light, the LED element 2 to emit ultraviolet light may be used together with a glass material containing red, green and blue phosphors.

Although in the fourth embodiment, the second glass member 48 contains the phosphor 48c, a layer including a phosphor may be formed on the interface 9 between the first glass member 7 and the second glass member 48 or on the upper surface 48b of the second glass member 48.

Fifth Embodiment

Figure 12:
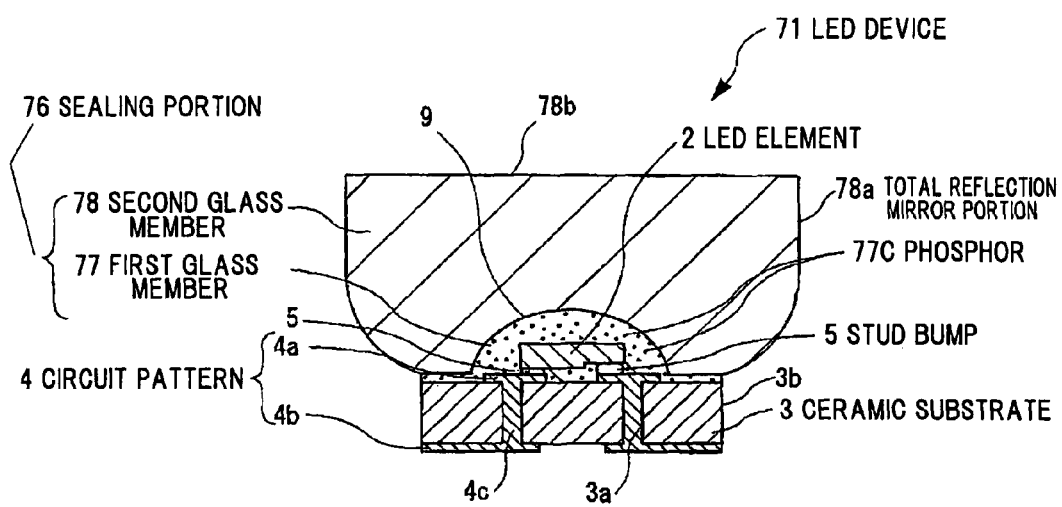
FIG. 12 is a longitudinal cross sectional view schematically showing an LED device in a fifth preferred embodiment according to the invention.

FIG. 12 is a cross sectional view schematically showing an LED device in the fifth preferred embodiment according to the invention. In FIG. 12, like components are indicated by the same numerals as used in the first embodiment, and the explanation thereof is appropriately omitted.

As shown in FIG. 12, a sealing portion 76 of the LED device 71 is composed of a first glass member 77 sealing the LED element 2, formed on the ceramic substrate 3, and a second glass member 78 formed on the first glass member 77. The first glass member 77 is made of, e.g., ZnO based heat melting glass, covering the ceramic substrate 3, and is formed in a hemispherical shape on the LED element 2. The first glass member 77 may be constructed such that it does not perfectly cover the ceramic substrate 3. For example, the first glass member 77 has a glass transition temperature (Tg) of 485° C. and a yielding point (At) of 517° C. The first glass member 77 has a thickness of 0.5 mm.

The first glass member 77 contains phosphor 77c, and the phosphor 77c emits wavelength conversion light when being excited by blue light emitted from the LED element 2. The phosphor 77c includes, e.g., YAG (Yttrium Aluminum Garnet) based and BOS (Barium Ortho-Silicate) based phosphors.

The second glass member 78 is made of, e.g., $SiO-B_2O_3$ based heat melting glass, and a side surface thereof forms a total reflection mirror portion 78a to reflect upward a light emitted laterally from the LED element 2. As shown in FIG. 12, the total reflection mirror portion 78a has a curve portion to reflect upward a light emitted from the LED element 2, formed at the bottom side (near the ceramic substrate 3), and a linear portion to reflect a light obliquely and upward emitted from the LED element 2, formed in the upper side. The upper surface 78b of the second glass member 78 is formed to be parallel to the mounting surface of the ceramic substrate 3. The second glass member 78 has a glass transition temperature (Tg) of 560° C. The second glass member 78 uses a preformed glass in which the total reflection mirror portion 78a is preliminarily molded.

In the LED device 71 thus structured, the first glass member 77 can uniformly wavelength-convert a light emitted from the LED elements 2, and the light extraction efficiency from the LED element 2 can be significantly enhanced.

MODIFICATIONS

A. Although in the first to fifth embodiments, the LED element 2 is used that is made of the GaN based semiconductor material, it is not limited to the GaN based LED element 2 and may be an LED element made of the other semiconductor materials. Also, the emission wavelength of the LED element 2 may be optionally changed.

B. Although in the first to fifth embodiments, the interim product 10 (See FIG. 3) is cut by the dicer, the ceramic substrate 3 may be cut by scribing. The LED element 2 may be formed by scribing. In this case, since the LED element 2 formed by scribing may have a sharpened concave and convexity on the cut face, it is preferable that the cut face is coated by element coating materials. The element coating materials include $SiO_2$ based coating materials with transparency. The use of the element coating materials can prevent the generation of cracks and voids in overmolding process etc.

C. In the first to fifth embodiments, the glass sealing is conducted by bonding the glass member to the substrate by the hot pressing. However, when the second glass member is formed an optical surface (including, e.g., a planar surface and a roughened surface), or when the phosphor-containing glass member should have an accurate phosphor concentration or thickness, the glass sealing may be conducted by high temperature melting without the pressing to have desired optical characteristics. However, in this case, it is necessary to select a glass material processable at a temperature causing no thermal damage to the optical element.

D. In the first to fifth embodiments, the sealing portions 6, 16, 26, 36, 46, 56, 66, 76 may have a silicone based resin coated on the surface thereof, whereby deterioration of glass due to dew condensation under a high temperature condition can be prevented. The coating material coated on the surface of the sealing portions 6, 16, 26, 36, 46, 56, 66, 76 preferably includes coating materials with humidity resistance, acid resistance and alkali resistance, such as $SiO_2$ based and $Al_2O_3$ based coating materials.

E. In the first to fifth embodiments, the ceramic substrates 3, 13 can be made of ceramic materials other than alumina. The ceramic substrates 3, 13 may be made of, e.g., BeO (with a thermal expansion coefficient ($\alpha$) of $7.6 \times 10^{-6}/°$ C. and a heat conductivity of 250 W/(m·k)), which is a high heat conductive material with higher heat conductivity than alumina. The BeO substrate can be also well sealed with the glass materials.

Alternatively, a W—Cu substrate can be also used as the high heat conductive substrate. The W—Cu substrate may include, e.g., a W90-Cu10 substrate (with a thermal expansion coefficient ($\alpha$) of $6.5 \times 10^{-6}/°$ C. and a heat conductivity of 180 W/(m·k) and a W85-Cu15 substrate (with a thermal expansion coefficient ($\alpha$) of $7.2 \times 10^{-6}/°$ C. and a heat conductivity of 190 W/(m·k)). By using these, a high heat conductivity can be ensured as well as a good adhesive strength to the sealing portion, so that they can be sufficiently adapted to LED devices with large emission and high output.

F. Although in the first to fifth embodiments, the LED devices 1, 11, 21, 31, 41, 51, 61, 71 use the LED element 2 as an optical element, they can use the other optical element. For example, an LD element may be also used. In addition, a light receiving element can be used as the optical element instead of the light emitting element to compose, e.g., a solar battery.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method for making an optical device, comprising:
    supporting a side of a ceramic substrate, opposite a mounting surface of the ceramic substrate with a light-emitting element mounted thereon, by a first mold;
    supporting a laminate comprising a first glass member and a second glass member, on a side of the second glass member by a second mold, the second glass member comprising a glass transition temperature greater than a glass transition temperature of the first glass member; and
    pressing the first mold toward the second mold while the mounting surface of the ceramic substrate is disposed opposite the first glass member of the laminate so as to embed the light-emitting element in the first glass member
    wherein thermal expansion coefficients of the first and second glass members are substantially equal to a thermal expansion coefficient of the ceramic substrate.

2. The method according to claim 1, wherein the second glass member comprises a preformed glass comprising an optical surface preliminarily formed on a side opposite the first glass member.

3. The method according to claim 1, wherein the light-emitting element comprises a semiconductor.

4. The method according to claim 1, wherein the second glass member comprises an optical surface formed on an outer surface thereof configured to optically control a light to enter into or to be emitted from the light-emitting element.

5. The method according to claim 1, wherein the first glass member comprises a glass including ZnO and the second glass member comprises $SiO$—$B_2O_3$ based heat melting glass.

6. The method according to claim 1, wherein at least one of the first glass member and second glass member comprises a phosphor material configured to be excited by a light with a predetermined wavelength to emit a wavelength conversion light.

7. The method according to claim 6, wherein the phosphor material comprises a phosphor particle.

8. The method according to claim 1, wherein the ceramic substrate comprises a first conductive pattern formed on the mounting surface of the ceramic substrate, a second conductive pattern formed on a side of the ceramic substrate opposite the mounting surface of the ceramic substrate, and a third conductive pattern extending in a thickness direction of the ceramic substrate to electrically connect the first conductive pattern and the second conductive pattern.

9. The method according to claim 1, wherein the first glass member comprises a refractive index not less than 1.6.

10. The method according to claim 1, wherein the light-emitting element comprises a GaN-based light-emitting diode element comprising a GaN-based semiconductor layer formed on a growth substrate.

11. The method according to claim 1, wherein the second glass member comprises a roughed surface portion on a side of the second glass member opposite the first glass member.

12. The method according to claim 1, further comprising:
bonding the first glass member to the ceramic substrate during a first processing condition; and
separating the second glass member from the second mold during a second processing condition.

13. The method according to claim 12, wherein the first processing condition and the second processing condition comprise at least one of a temperature of the first glass member, a temperature of the second glass member, a pressure applied to the first glass member and a pressure applied to the second glass member.

14. A method of making an optical device, comprising:
supporting a side of a ceramic substrate, opposite a mounting surface of the ceramic substrate with a light-emitting element comprising an LED mounted thereon, by a first mold;
supporting a laminate comprising a first glass member comprising a $B_2O_3$—$SiO_2$—$ZnO$—$Nb_2O_5$ based glass and a second glass member, on a side of the second glass member by a second mold, the second glass member comprising a mold separation property greater than a mold separation property of the first glass member; and
pressing the first mold toward the second mold while the mounting surface of the ceramic substrate is disposed opposite the first glass member of the laminate so as to embed the light-emitting element in the first glass member,
wherein thermal expansion coefficients of the first and second glass members are substantially equal to a thermal expansion coefficient of the ceramic substrate.

* * * * *